United States Patent
Nitta

(10) Patent No.: US 12,444,385 B2
(45) Date of Patent: Oct. 14, 2025

(54) SEMICONDUCTOR DEVICE CONFIGURED TO DETECT AN ABNORMALITY OF AN EXTERNAL OSCILLATION SIGNAL, DISPLAY APPARATUS, AND VEHICLE

(71) Applicant: ROHM CO., LTD., Kyoto (JP)

(72) Inventor: Tomonori Nitta, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 18/436,328

(22) Filed: Feb. 8, 2024

(65) Prior Publication Data

US 2024/0177684 A1 May 30, 2024

Related U.S. Application Data

(63) Continuation of application No. PCT/JP2022/025734, filed on Jun. 28, 2022.

(30) Foreign Application Priority Data

Sep. 16, 2021 (JP) .................................. 2021-151392

(51) Int. Cl.
G09G 3/36 (2006.01)

(52) U.S. Cl.
CPC ......... *G09G 3/3696* (2013.01); *G09G 3/3655* (2013.01); *G09G 2310/0278* (2013.01); *G09G 2310/08* (2013.01)

(58) Field of Classification Search
None
See application file for complete search history.

(56) References Cited

U.S. PATENT DOCUMENTS

| | | | |
|---|---|---|---|
| 2006/0017510 A1* | 1/2006 | Momii | H03L 7/08 331/1 A |
| 2017/0302285 A1* | 10/2017 | Niwa | H03B 5/36 |
| 2019/0237033 A1* | 8/2019 | Sugimoto | H01L 21/822 |

(Continued)

FOREIGN PATENT DOCUMENTS

| | | | |
|---|---|---|---|
| JP | 03253135 A | * | 11/1991 |
| JP | H03-253135 | | 11/1991 |
| JP | 06125254 A | * | 5/1994 |

(Continued)

OTHER PUBLICATIONS

International Search Report and Written Opinion in International Appln. No. PCT/JP2022/025734, mailed on Sep. 27, 2022, 15 pages (with machine translation).

*Primary Examiner* — Kirk W Hermann
(74) *Attorney, Agent, or Firm* — Fish & Richardson P.C.

(57) ABSTRACT

A semiconductor device includes, for example, an external terminal configured to accept an external input of an external oscillation signal, an internal oscillation portion configured to generate an internal oscillation signal, a logic inversion detection portion configured to generate a reset signal upon detecting logic inversion of a first internal signal corresponding to the external oscillation signal, a monitor counter configured to increase or decrease a count output value in accordance with the internal oscillation signal and to reset the count output value in accordance with the reset signal, and an abnormality detection portion configured to detect, in accordance with the count output value, whether or not there is an abnormality in the external oscillation signal.

8 Claims, 13 Drawing Sheets

(56) References Cited

U.S. PATENT DOCUMENTS

2020/0021243 A1\* 1/2020 Uehara .................. H03B 5/368

FOREIGN PATENT DOCUMENTS

| JP | H06-125254 | | 5/1994 |
|----|------------|---|--------|
| JP | 09018306 A | \* | 1/1997 |
| JP | H09-018306 | | 1/1997 |
| WO | WO 2018/066292 | | 4/2018 |

\* cited by examiner

SEMICONDUCTOR DEVICE CONFIGURED TO DETECT AN ABNORMALITY OF AN EXTERNAL OSCILLATION SIGNAL, DISPLAY APPARATUS, AND VEHICLE

CROSS-REFERENCE TO RELATED APPLICATIONS

This nonprovisional application is a continuation application of International Patent Application No. PCT/JP2022/025734 filed on Jun. 28, 2022, which claims priority to Japanese Patent Application No. 2021-151392 filed on Sep. 16, 2021, the entire contents of which are hereby incorporated by reference.

TECHNICAL FIELD

The invention disclosed in the present description relates to a semiconductor device, and a display apparatus and a vehicle using the semiconductor device.

BACKGROUND ART

There is a type of semiconductor device equipped with a function of generating an internal clock signal to be used inside the device by using an external oscillation signal inputted from outside the device.

An example of a conventional technique related to the above can be seen in Patent Document 1.

CITATION LIST

Patent Literature

Patent Document 1: Pamphlet of International Publication No. WO 2018/066292

DESCRIPTION OF EMBODIMENTS

<Display Apparatus>

Figure 1:
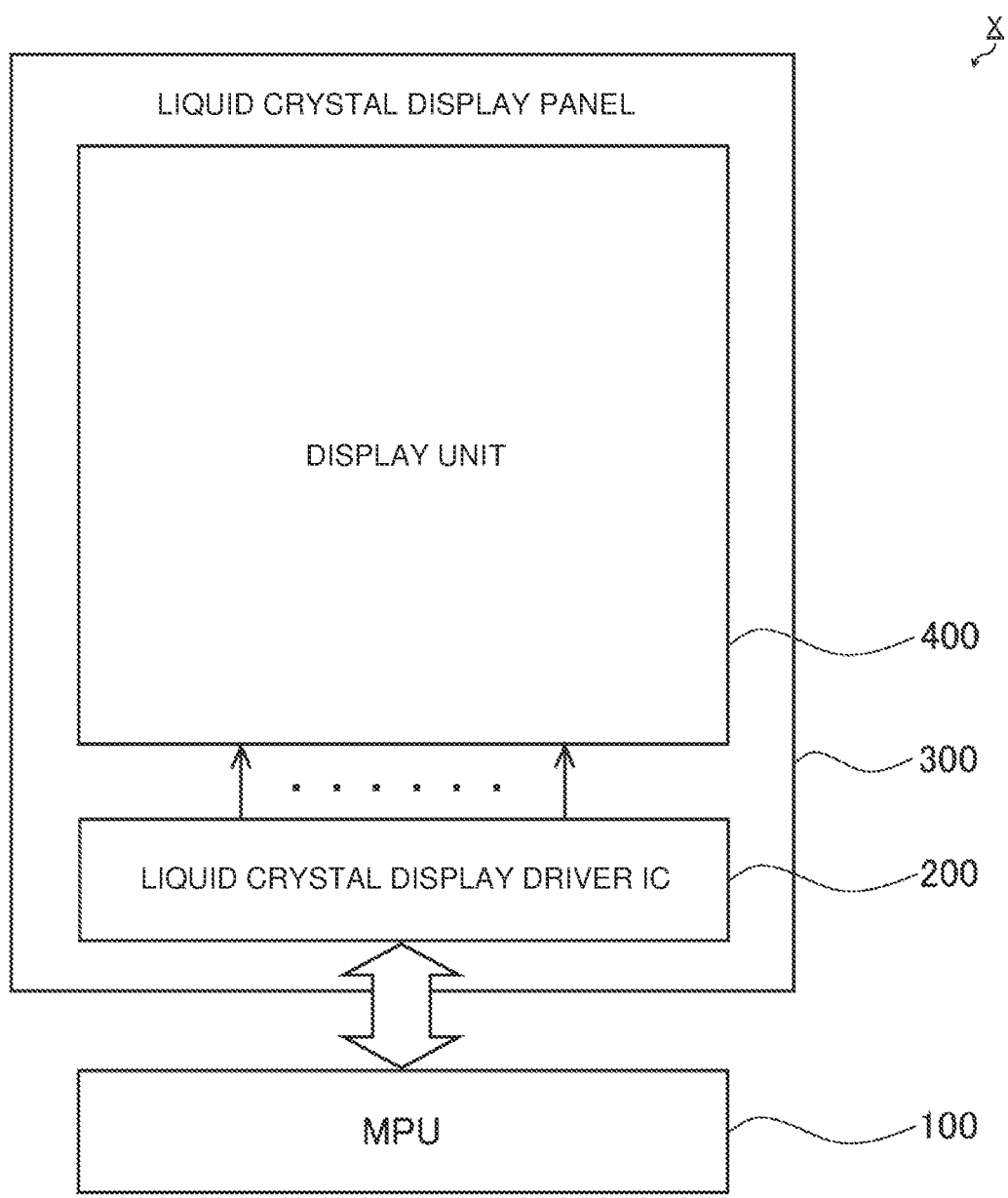
FIG. 1 is a schematic view showing an overall configuration of a display apparatus.

FIG. 1 is a schematic view showing an overall configuration of a display apparatus X. The display apparatus X of this configuration example includes an MPU [micro processing unit] 100 that is a host device, a liquid crystal display driver IC 200 that receives display data from the MPU 100, and a liquid crystal display panel 300 that receives drive control signals (scan signals COM0 to COM3 and data signals SEG0 to SEG9, which will be described later) from the liquid crystal display driver IC 200.

The liquid crystal display panel 300 includes a display unit 400 formed on a glass substrate. The liquid crystal display driver IC 200 is, for example, a semiconductor device mounted by COG [chip-on-glass] mounting on the glass substrate of the liquid crystal display panel 300, receives the display data from the MPU 100, and outputs the drive control signals to the display unit 400, thus driving the liquid crystal display panel 300.

<Liquid Crystal Display Driver IC>

Figure 2:
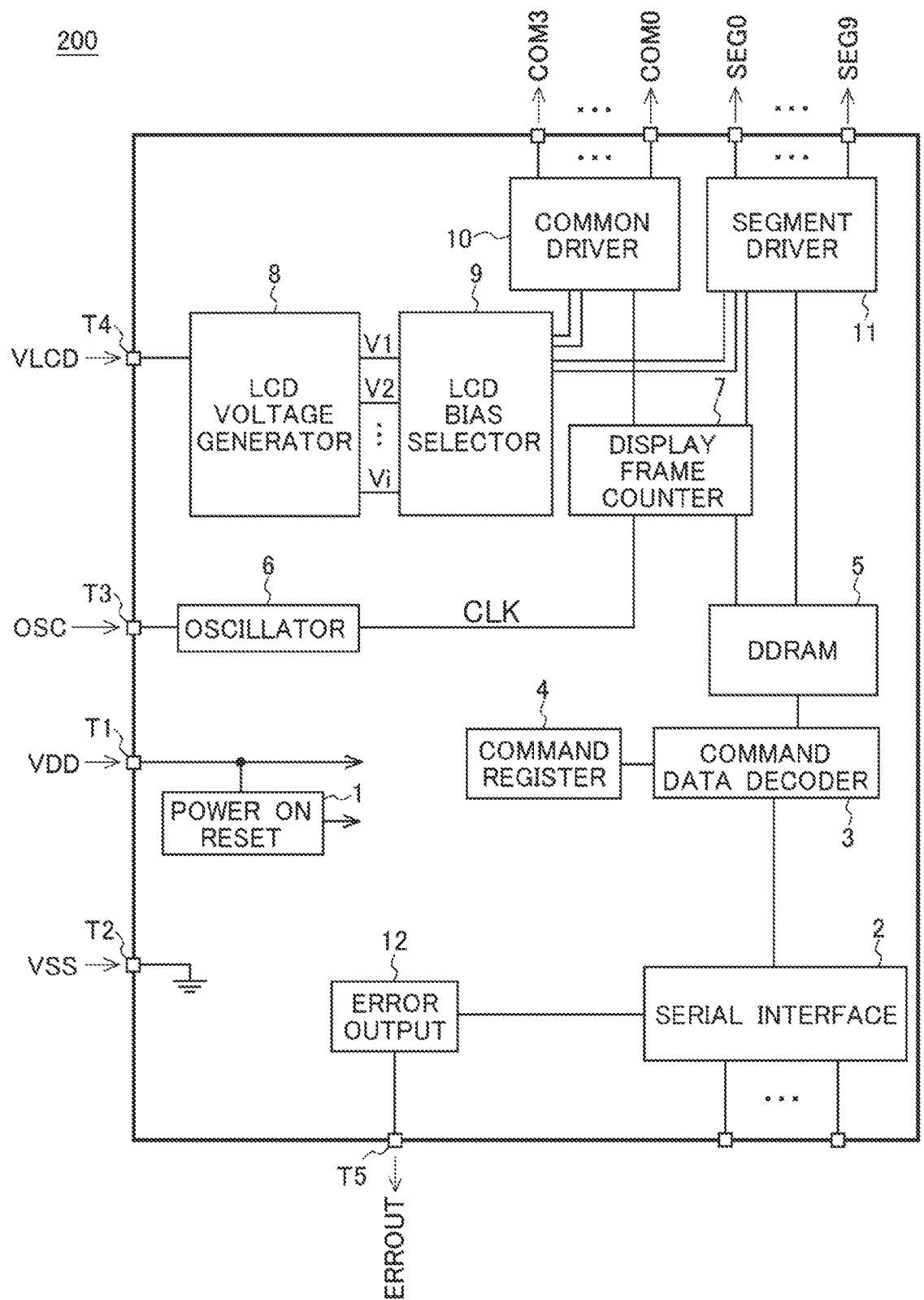
FIG. 2 is a block diagram showing a configuration example of a liquid crystal display driver IC.

FIG. 2 is a block diagram showing a configuration example of the liquid crystal display driver IC 200. The liquid crystal display driver IC 200 of this configuration example is driven using an internal power supply voltage that is a difference between a power supply voltage VDD applied to an external terminal T1 and a ground voltage VSS applied to an external terminal T2.

With reference to this figure, the liquid crystal display driver IC 200 includes a power on reset circuit 1, a serial interface 2, a command data decoder 3, a command register 4, a display data RAM 5 [a random access memory], an oscillator 6, a display frame counter 7, a liquid crystal voltage generator 8, a liquid crystal bias selector 9, a common driver 10 (hereinafter, referred to as a COM driver 10), a segment driver 11 (hereinafter, referred to as a SEG driver 11), and an error signal output circuit 12. Needless to say, any other functional block than the above-described ones may be integrated into the liquid crystal display driver IC 200.

Upon a decrease in the power supply voltage VDD applied to the external terminal T1, the power on reset circuit 1 resets operations of the liquid crystal display driver IC 200 as a whole.

The serial interface 2 performs, with the MPU 100 provided outside the liquid crystal display driver IC 200, serial bus communication complying with I2C [inter-integrated circuit] or the like. The serial interface 2 is a logic circuit and outputs, to the command data decoder 3, serial data outputted from the MPU 100 while retaining the serial data in a register.

The command data decoder 3 refers to a register value written into the command register 4 and decodes, based thereon, a command included in the serial data outputted from the serial interface 2.

The display data included in the serial data outputted from the serial interface 2 is outputted from the command data decoder 3 to the display data RAM 5.

The oscillator 6 generates an internal clock signal CLK by using one of an external oscillation signal OSC supplied to an external terminal T3 and an internal oscillation signal generated by oscillations of the oscillator 6 itself and outputs the internal clock signal CLK to the display frame counter 7 (details of this will be described later).

Based on the internal clock signal CLK outputted from the oscillator 6, the display frame counter 7 performs timing control (for example, dynamic driving and AC voltage driving of the liquid crystal display panel 300, details of which will be described later) for every display frame.

The liquid crystal voltage generator 8 divides a constant voltage VLCD for liquid crystal driving supplied to an external terminal T4 so as to generate i types (where i≥2) of voltages V1 to Vi. The voltages V1 to Vi have a relationship V1>V2> . . . >Vi, in which the voltage V1 is equal in value to the constant voltage VLCD and the voltage Vi is equal in value to the ground voltage VSS.

The liquid crystal bias selector 9 supplies a voltage selected from among the voltages V1 to Vi to the COM driver 10 and the SEG driver 11.

The COM driver 10 generates the scan signals COM0 to COM3 by using an output of the liquid crystal bias selector 9 and outputs the scan signals COM0 to COM3 to the display unit 400.

Based on the display data outputted from the display data RAM 5, the SEG driver 11 generates the data signals SEG0 to SEG9 by using an output of the liquid crystal bias selector 9 and outputs the data signals SEG0 to SEG9 to the display unit 400.

The number (=4) of the scan signals COM and the number (=10) of the data signals SEG in this configuration example are nothing but an example, and the scan signals COM and the data signals SEG are not limited in number to those in this configuration example.

The error signal output circuit 12 detects breakage of glass of the liquid crystal display panel 300, faulty COG mounting, a defective digital circuit, a serial bus communication error (such as a checksum error due to erroneous writing caused by noise), stoppage of toggling (AC inversion) of any of the scan signals COM or the data signals SEG, or the like and outputs a result of the detection as an error signal ERROUT to the MPU 100.

<Wiring Pattern>

Figure 3:
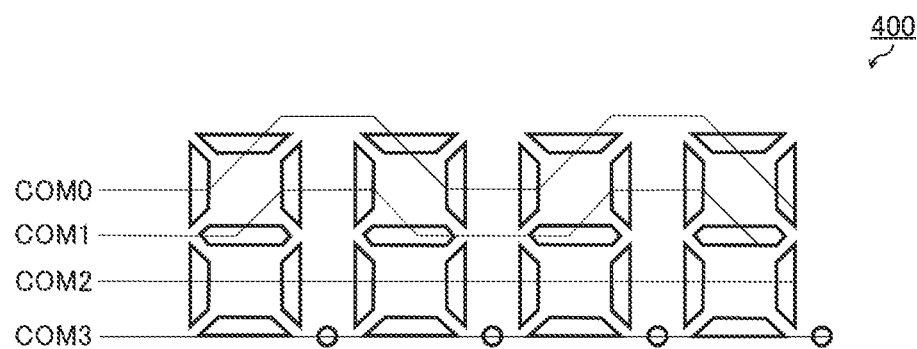
FIG. 3 is a view showing an example of a pattern of COM lines.

FIG. 3 is a view showing an example of a pattern of COM lines in the display unit 400. In the display unit 400, four COM lines supplied to the scan signals COM0 to COM3, respectively, are arranged, for example, as shown in FIG. 3.

Figure 4:
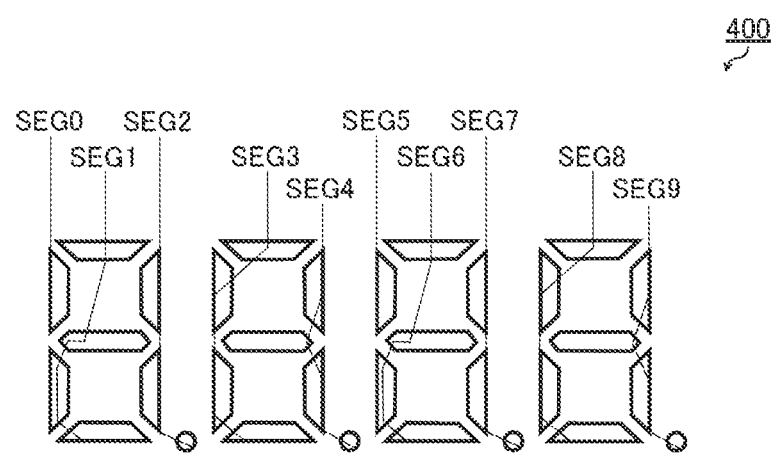
FIG. 4 is a view showing an example of a pattern of SEG lines.

FIG. 4 is a view showing an example of a pattern of SEG lines in the display unit 400. In the display unit 400, ten SEG lines supplied to the data signals SEG0 to SEG9, respectively, are arranged, for example, as shown in FIG. 4.

Figure 5:
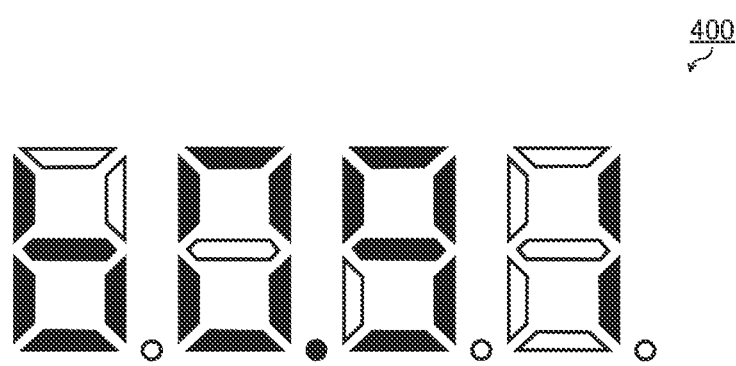
FIG. 5 is a view showing an example of segment display.

FIG. 5 is a view showing an example of segment display in the display unit 400. According to the pattern example of the COM lines shown in FIG. 3 and the pattern example of the SEG lines shown in FIG. 4, it becomes possible to perform, for example, the segment display (generally referred to as seven-segment display) shown in FIG. 5.

<Liquid Crystal Display Panel>

Next, a brief description is given of an operation principle of the liquid crystal display panel 300 of a TN [twisted nematic] type.

The liquid crystal display panel 300 (particularly, the display unit 400) includes a pair of polarization plates (orientation films) each having fine streak-shaped grooves formed therein. The pair of polarization plates is laid out so that the polarization plates overlap each other with a predetermined gap therebetween and the grooves of one of the polarization plates are orthogonal to the grooves of the other of the polarization plates. Liquid crystal molecules are injected into the above-described gap.

In a state where no voltage is applied between the pair of polarization plates, the liquid crystal molecules injected into the gap are arrayed along the grooves of the polarization plates. In this case, however, since the grooves engraved in one of the pair of polarization plates are orthogonal to the grooves engraved in the other of the polarization plates, the liquid crystal molecules are arrayed while being twisted and become stable in that state. Accordingly, a vibration direction of light incident on one of the polarization plates (=one on a backlight side) is twisted by 90° along rows of the twisted liquid crystal molecules, and thus the light passes through the other of the polarization plates (=the other one on a display surface side) without being interrupted thereby. This state corresponds to a bright display state (an ON state) of liquid crystal pixels.

On the other hand, in a state where a voltage is applied between the pair of polarization plates, the liquid crystal molecules are excited by an electric field generated in the gap and thus are arrayed with regularity in a direction along the electric field. As a result, a vibration direction of light incident on the one of the polarization plates (=the one on the backlight side) no longer changes, and thus the light can no longer pass through the other of the polarization plates (the other one on the display surface side). This state corresponds to a dark display state (an OFF state) of the liquid crystal pixels.

<Dynamic Driving Method>

Next, a brief description is given of a dynamic driving method for driving the liquid crystal display panel 300 (particularly, the display unit 400).

Figure 6:
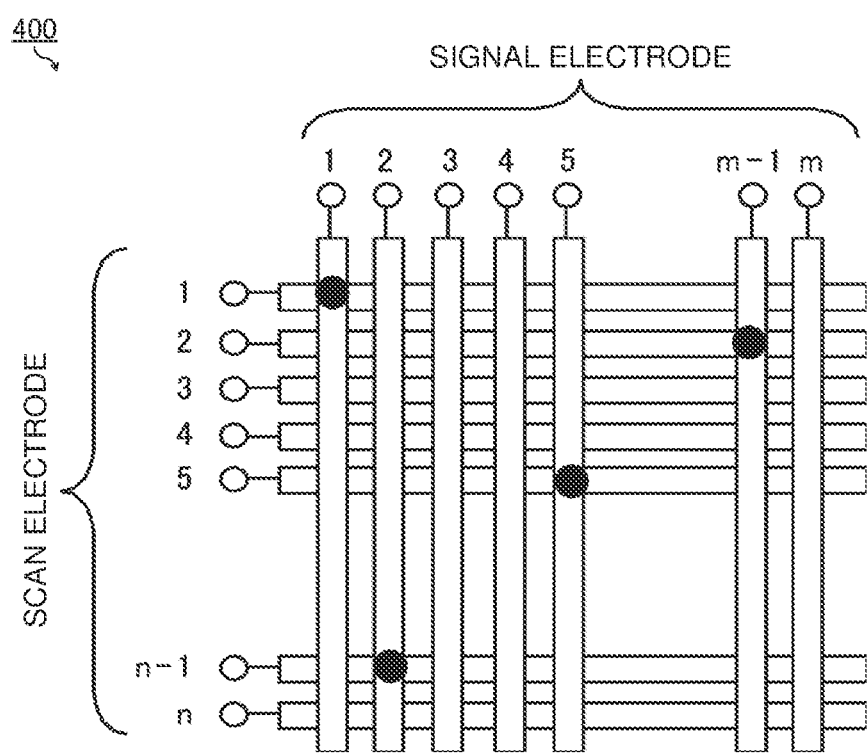
FIG. 6 is a view showing a configuration example (a matrix pattern) of a display unit.

FIG. 6 is a view showing a configuration example (a matrix pattern) of the display unit 400. While this figure shows, for the sake of convenience of explanation, a pattern example in which m signal electrodes (=SEG lines) extending in an up-down direction in the drawing of this figure and n scan electrodes (=COM lines) extending in a left-right direction in the drawing of this figure are opposed to each other in a matrix manner, the display unit 400 may perform the segment display as shown previously in FIG. 3 to FIG. 5.

Figure 7:
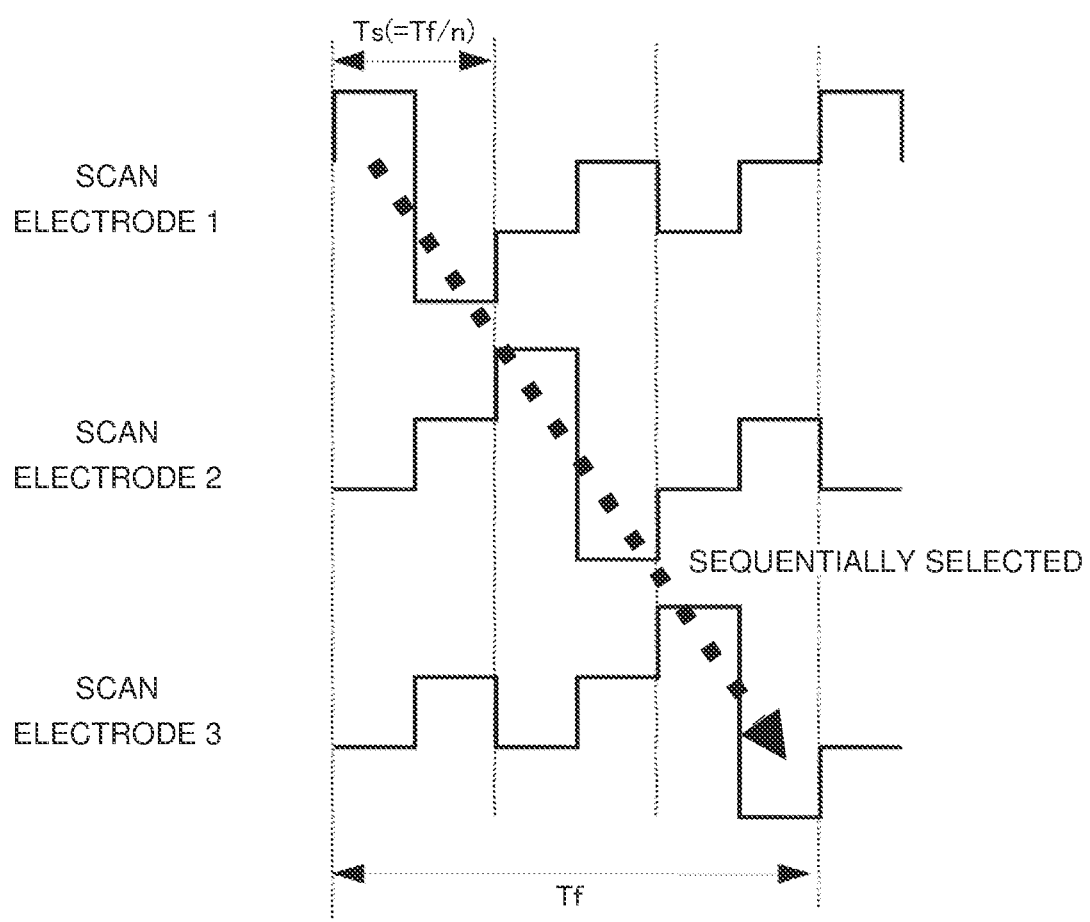
FIG. 7 is a view showing an operation of sequentially selecting a scan electrode.

FIG. 7 is a view showing an operation of sequentially selecting a scan electrode. As shown in this figure, in every selection period Ts (=Tf/n) obtained by dividing a frame cycle Tf by n, a selection waveform is sequentially applied to one of scan electrodes 1 to n (n=3 in this figure). On the other hand, in synchronism with the selection waveform applied to the one of scan electrodes 1 to n, an ON waveform or an OFF waveform for each pixel is sequentially applied to signal electrodes 1 to m. This way of driving makes it possible for all pixels formed at intersections of the signal electrodes and the scan electrodes to be arbitrarily turned on/off (bright display/dark display).

By adopting the dynamic driving method, it becomes possible to reduce the number of terminals of the liquid crystal display driver IC 200 with respect to the number of pixels of the liquid crystal display panel 300. While the larger the number of times the liquid crystal display panel 300 is scanned, the more likely a contrast decrease is to occur, such an issue can be avoided by increasing a voltage to be applied to the scan electrodes and the signal electrodes. The dynamic driving method, therefore, is adopted by most types of liquid crystal display apparatuses.

<AC Voltage Driving>

Next, a brief description is given of the AC voltage driving of the liquid crystal display panel 300 (particularly, the display unit 400).

Figure 8:
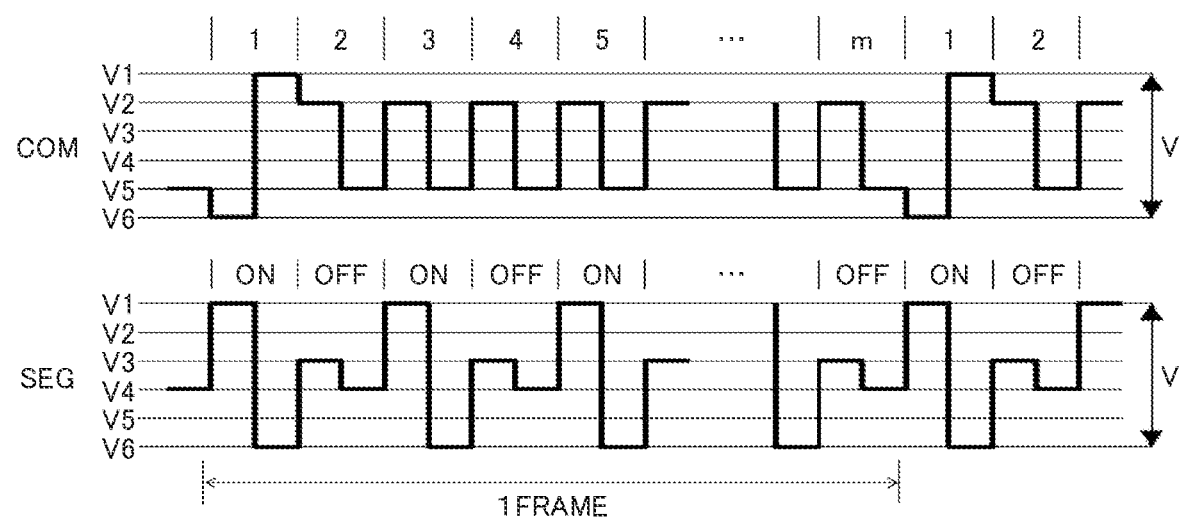
FIG. 8 is a view showing an example of drive waveforms of a scan signal and a data signal.

FIG. 8 is a view showing an example of drive waveforms (line inversion driving, 1/m duty, 1/5 bias) of a scan signal COM and a data signal SEG applied to the liquid crystal display panel 300. As shown in this figure, when a voltage difference between the scan signal COM and the data signal SEG is largest, i.e., |COM−SEG|=V1−V6, a segment or a pixel is turned on (bright display). On the other hand, when |COM−SEG|<V1−V6, the segment or the pixel is turned off (dark display).

Particularly in the line inversion driving, in every selection period, application polarities of the scan signal COM and the data signal SEG are inverted. By performing such AC voltage driving, it is possible to avoid a state where a constant voltage (DC voltage) is always applied to the liquid crystal molecules. Accordingly, it becomes possible to prevent occurrence of burn-in on the liquid crystal display panel 300 (particularly, the display unit 400).

Although not specifically illustrated, as the AC voltage driving of the liquid crystal display panel 300, there may be performed, instead of the above-described line inversion driving, frame inversion driving in which the application polarities of the scan signal COM and the data signal SEG are inverted for every display frame. Furthermore, an order of the application polarities of the scan signal COM and the data signal SEG is not particularly specified.

<Oscillator>

Figure 9:
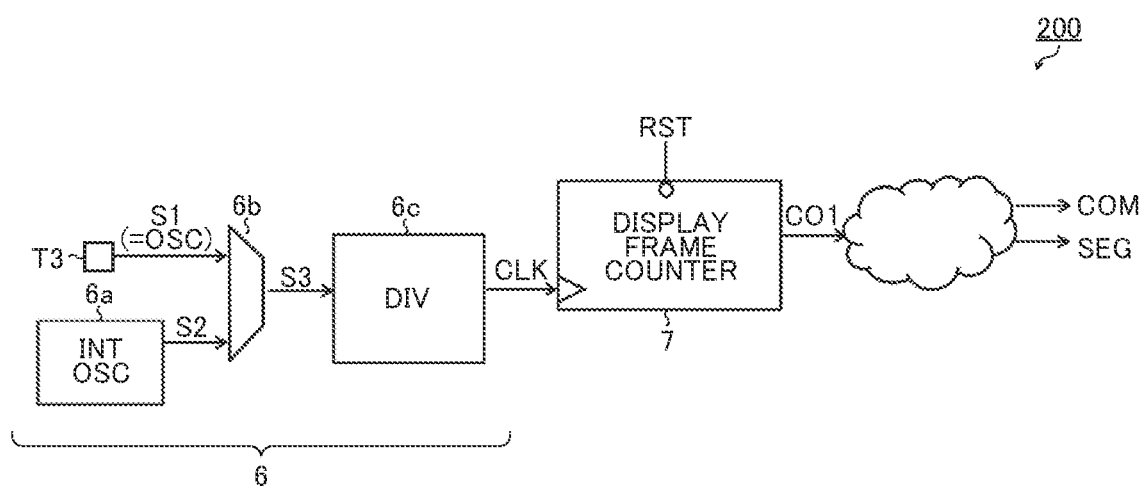
FIG. 9 is a view showing a configuration example of an oscillator.

FIG. 9 is a view showing a configuration example of the oscillator 6 (and peripheral circuitry thereof). The oscillator 6 of this configuration example includes an internal oscillation portion 6a, a selector 6b, and a frequency divider 6c.

The external terminal T3 accepts an external input of an external oscillation signal S1 (=corresponding to the external oscillation signal OSC described earlier).

The internal oscillation portion 6a generates an internal oscillation signal S2.

The selector 6b outputs, as a selected oscillation signal S3, one of the external oscillation signal S1 and the internal oscillation signal S2.

The frequency divider 6c divides a frequency of the selected oscillation signal S3 so as to generate the internal clock signal CLK.

As described above, the oscillator 6 generates the internal clock signal CLK by using one of the external oscillation signal S1 and the internal oscillation signal S2. When the internal clock signal CLK is generated using the external oscillation signal S1, driving of the internal oscillation portion 6a may be stopped for reduction of power consumption.

The display frame counter 7 (=corresponding to a main counter) increases or decreases a count output value CO1 in accordance with the internal clock signal CLK and resets the count output value CO1 to an initial value in accordance with a reset signal RST.

The count output value CO1 is used for timing control for every display frame, for example, the AC voltage driving of the drive control signals (=the scan signal COM and the data signal SEG) in the COM driver 10 and the SEG driver 11.

Figure 10:
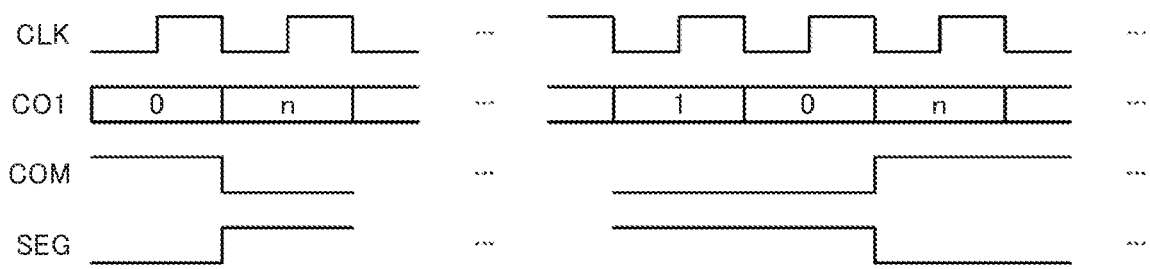
FIG. 10 is a view showing a basic operation of AC voltage driving.

FIG. 10 is a view showing a basic operation of the AC voltage driving, in which the internal clock signal CLK, the count output value CO1, the scan signal COM, and the data signal SEG are depicted in order from top to bottom.

In an example shown in this figure, the count output value CO1 is decremented by one from an initial value n at each of pulse edges of the internal clock signal CLK. Further, when a lower limit value (for example, 0) of the count output value CO1 is reached, the count output value CO1 is reset to the initial value n at a next occurring one of the pulse edges. The application polarities of the scan signal COM and the data signal SEG are inverted at this reset timing, and thus the AC voltage driving can be achieved.

Meanwhile, in a case where an abnormality (for example, pulse stoppage) has occurred in the external oscillation signal S1 when the internal clock signal CLK is being generated using the external oscillation signal S1, the application polarities of the scan signal COM and the data signal SEG can no longer be inverted. Such a situation brings about a state where a constant voltage (DC voltage) is always applied to the liquid crystal molecules and thus might result in occurrence of burn-in on the liquid crystal display panel 300 (particularly, the display unit 400).

To solve the above-described drawback, the following proposes the liquid crystal display driver IC 200 including an abnormality detection circuit.

<Abnormality Detection Circuit>

Figure 11:
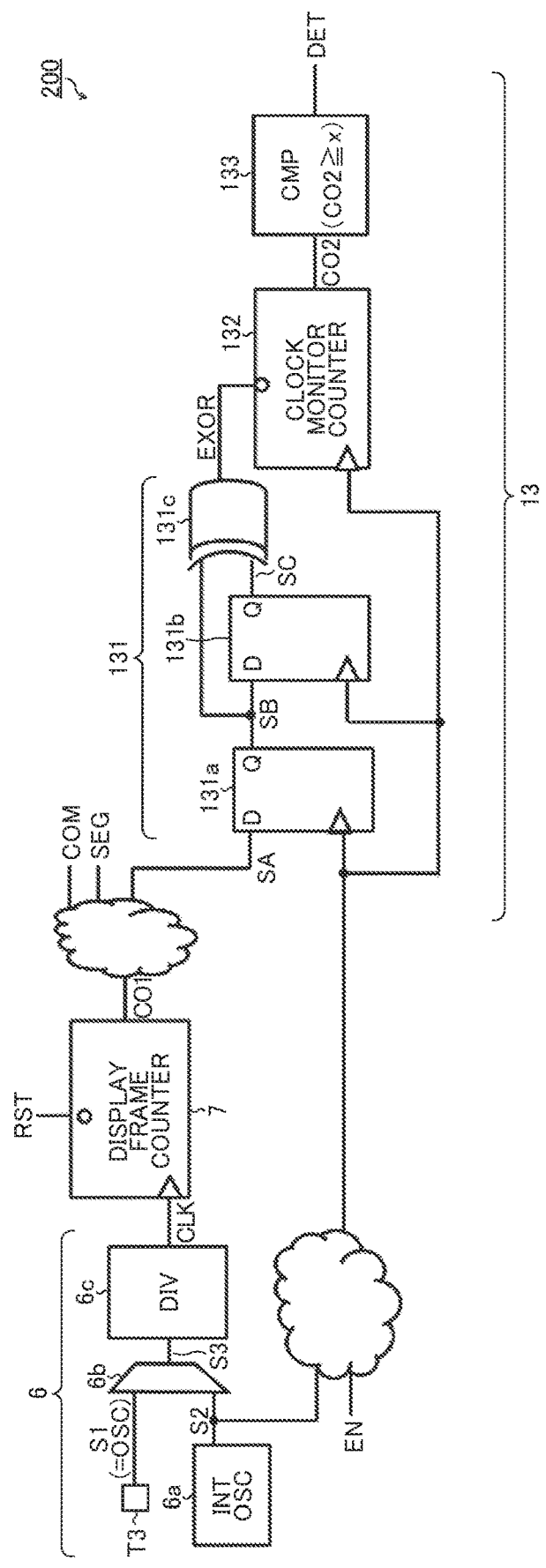
FIG. 11 is a view showing a configuration example of an abnormality detection circuit.

FIG. 11 is a view showing a configuration example of the abnormality detection circuit (particularly, the liquid crystal display driver IC 200 including the same). The liquid crystal display driver IC 200 of this configuration example is configured basically as shown in FIG. 9 referred to earlier and further includes an abnormality detection circuit 13.

The abnormality detection circuit 13 is a circuit block for monitoring an abnormality (for example, pulse stoppage) in the external oscillation signal S1 and includes a logic inversion detection portion 131, a clock monitor counter 132, and an abnormality detection portion 133.

The logic inversion detection portion 131 is a circuit block for generating a reset signal EXOR upon detecting logic inversion of a first internal signal SA corresponding to the external oscillation signal S1 and includes D flip-flops 131a and 131b and an exclusive OR gate 131c. The first internal signal SA is a binary signal whose logic level is inverted at a timing when the application polarities of the scan signal COM and the data signal SEG are inverted in accordance with the internal clock signal CLK.

The D flip-flop 131a latches the first internal signal SA inputted to a data input terminal (D) in synchronism with the internal oscillation signal S2 inputted to a clock input terminal so as to generate a second internal signal SB to be outputted from an output terminal (Q). That is, in the D flip-flop 131a, the first internal signal SA in synchronism with the internal clock signal CLK (and hence, the external oscillation signal S1) is synchronized with the internal oscillation signal S2, and thus the second internal signal SB is generated.

The D flip-flop 131b latches the second internal signal SB inputted to a data input terminal (D) in synchronism with the internal oscillation signal S2 inputted to a clock input terminal so as to generate a third internal signal SC to be outputted from an output terminal (Q). That is, the third internal signal SC is a signal obtained by delaying a phase of the second internal signal SB by one clock of the internal oscillation signal S2.

The exclusive OR gate 131c performs an exclusive OR operation between the second internal signal SB and the third internal signal SC and outputs a result of the operation as the reset signal EXOR. Accordingly, the reset signal EXOR turns to a high level when only one of the second internal signal SB and the third internal signal SC is at a high level (i.e., when SB SC) and turns to a low level in any other cases (i.e., when SB=SC). As described above, in the exclusive OR gate 131c, a logic level of the reset signal EXOR is determined in accordance with whether or not the second internal signal SB agrees with the third internal signal SC.

The clock monitor counter 132 increases or decreases a count output value CO2 in accordance with the internal oscillation signal S2 and resets the count output value CO2 to an initial value in accordance with the reset signal EXOR.

The abnormality detection portion 133 detects, in accordance with the count output value CO2, whether or not an abnormality (for example, pulse stoppage) is occurring in the external oscillation signal S1 and outputs a result of the detection as an abnormality detection signal DET. For example, the abnormality detection portion 133 could compare the count output value CO2 with a predetermined upper limit value x and turns the abnormality detection signal DET to a low level (=a logic level in a normal state) when CO2<x, while raising the abnormality detection signal DET to a high level (=a logic level in an abnormality-detected state) when CO2≥x. Furthermore, an operation can be performed also when the logic level in the normal state is a high level and the logic level in the abnormality-detected state is a low level. That is, a relationship between the abnormality detection result and a logic level of the abnormality detection signal is not limited to the above-described one.

A configuration may be adopted in which the error signal output circuit 12 (see FIG. 2) described earlier outputs, to the MPU 100, the result of detecting an abnormality in the external oscillation signal S1 (=the abnormality detection signal DET) obtained in the abnormality detection circuit 13 as the error signal ERROUT. This configuration makes it possible to notify the MPU 100 that an abnormality (for example, pulse stoppage) has occurred in the external oscillation signal S1. Accordingly, for example, by forcibly stopping driving of the display apparatus X, it is possible to prevent burn-in on the liquid crystal display panel 300 (particularly, the display unit 400) from occurring.

Furthermore, a configuration may be adopted in which a function of detecting an abnormality in the external oscillation signal S1 by the abnormality detection circuit 13 is switchable to be enabled or disabled in accordance with an enable signal EN. For example, it is conceivable to supply the internal oscillation signal S2 to the abnormality detection circuit 13 when the function of detecting an abnormality in the external oscillation signal S1 is enabled and not to supply the internal oscillation signal S2 to the abnormality detection circuit 13 when the function of detecting an abnormality in the external oscillation signal S1 is disabled.

Furthermore, a configuration may be adopted in which while the external oscillation signal S1 is being used by the oscillator 6, the internal oscillation portion 6a is driven to generate the internal oscillation signal S2 when the function of detecting an abnormality in the external oscillation signal S1 is enabled and stops generating the internal oscillation signal S2 when the function of detecting an abnormality in the external oscillation signal S1 is disabled. In a case of adopting this configuration, for example, the above-described enable signal EN could be used to control enabling of the internal oscillation portion 6a.

Figure 12:
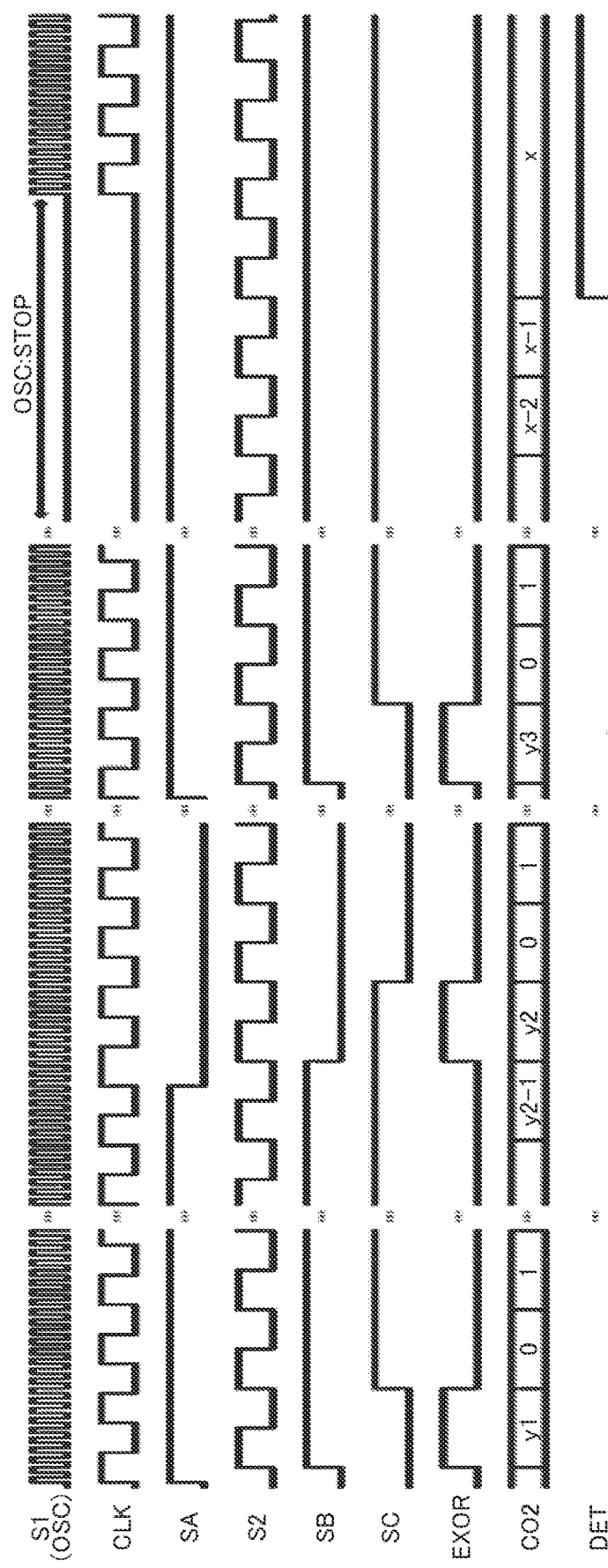
FIG. 12 is a view showing an example of an abnormality detection operation.

FIG. 12 is a view showing an example of an abnormality detection operation by the abnormality detection circuit 13, in which the external oscillation signal S1 (=OSC), the internal clock signal CLK, the first internal signal SA, the internal oscillation signal S2, the second internal signal SB, the third internal signal SC, the reset signal EXOR, the count output value CO2, and the abnormality detection signal DET are depicted in order from top to bottom. As for the count output value CO2, it is assumed that y1<x, y2<x, and y3<x.

When no pulse stoppage has occurred in the external oscillation signal S1, the internal clock signal CLK is generated, and thus logic inversion of the first internal signal SA occurs periodically. At a timing of the logic inversion of the first internal signal SA, the second internal signal SB and the third internal signal SC disagree in logic level, and thus pulses are generated in the reset signal EXOR. Accordingly, the count output value CO2 of the clock monitor counter 132 is reset to an initial value (for example, 0) before reaching the predetermined upper limit value x, and thus the abnormality detection signal DET is maintained at the low level (=the logic level in the normal state).

On the other hand, when pulse stoppage has occurred in the external oscillation signal S1, the internal clock signal CLK is not generated, and thus there no longer occurs logic inversion of the first internal signal SA. At this time, a state is brought about in which the second internal signal SB and the third internal signal SC always agree in logic level, and thus pulses are no longer generated in the reset signal EXOR. Accordingly, the count output value CO2 of the clock monitor counter 132 reaches the predetermined upper limit value x without being reset. As a result, the abnormality detection signal DET is raised to the high level (=the logic level in the abnormality-detected state).

As described above, according to the abnormality detection operation by the abnormality detection circuit 13, when pulse stoppage has occurred in the external oscillation signal S1 over a predetermined period, it is possible to detect an abnormality in the external oscillation signal S1.

This figure shows an example in which once the abnormality detection signal DET has risen to the high level, even when the external oscillation signal S1 recovers to a normal state after that, the abnormality detection signal DET is maintained at the high level. A behavior after abnormality detection, however, is not limited thereto, and there may be adopted, for example, a configuration in which the abnormality detection portion 133 is also reset using the reset signal EXOR so that the abnormality detection signal DET restores itself to the low level.

Furthermore, while this figure shows an example in which the external oscillation signal S1 is higher in frequency than the internal oscillation signal S2, there may also be a case where the external oscillation signal S1 is lower in frequency than the internal oscillation signal S2.

<Applications>

Figure 13:
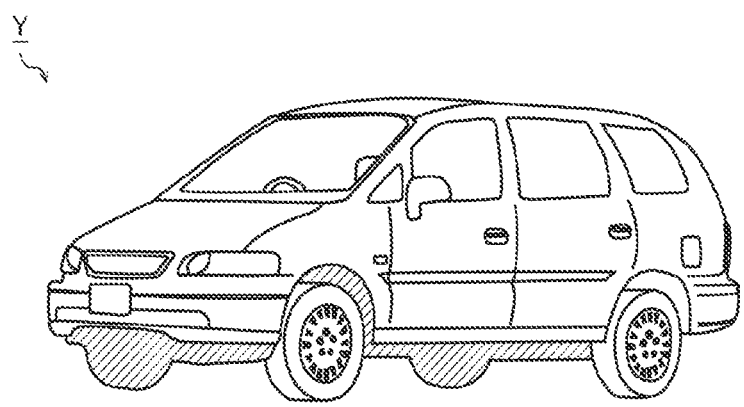
FIG. 13 is a view showing an appearance of a vehicle.

FIG. 13 is a view showing an appearance of a vehicle. A vehicle Y shown in this figure includes the display apparatus X described thus far. The display apparatus X can be suitably used as a part of an instrument panel (a meter cluster panel including a speed rpm indicator and so on) or a control panel for systems such as an in-vehicle air conditioning system and an automobile audio system, which is disposed at a position viewable by a driver.

<Overview>

To follow is an overview of the above-described various embodiments.

For example, the semiconductor device disclosed in the present description has a configuration (a first configuration) including an external terminal configured to accept an external input of an external oscillation signal, an internal oscillation portion configured to generate an internal oscillation signal, a logic inversion detection portion configured to generate a reset signal upon detecting logic inversion of a first internal signal corresponding to the external oscillation signal, a monitor counter configured to increase or decrease a count output value in accordance with the internal oscillation signal and to reset the count output value in accordance with the reset signal, and an abnormality detection portion configured to detect, in accordance with the count output value, whether or not there is an abnormality in the external oscillation signal.

The semiconductor device according to the above-described first configuration may have a configuration (a second configuration) further including an error signal output put circuit configured to externally output a result of detection by the abnormality detection portion as an error signal.

Furthermore, the semiconductor device according to the above-described first or second configuration may have a configuration (a third configuration) in which the logic inversion detection portion includes a first flip-flop configured to latch the first internal signal in synchronism with the internal oscillation signal so as to generate a second internal signal, a second flip-flop configured to latch the second internal signal in synchronism with the internal oscillation signal so as to generate a third internal signal, and a logic gate configured to determine a logic level of the reset signal in accordance with whether or not the second internal signal agrees with the third internal signal.

Furthermore, the semiconductor device according to any of the above-described first to third configurations may have a configuration (a fourth configuration) further including an oscillator configured to generate an internal clock signal by using one of the external oscillation signal and the internal oscillation signal.

Furthermore, the semiconductor device according to the above-described fourth configuration may have a configuration (a fifth configuration) in which the oscillator includes a selector configured to output, as a selected oscillation signal, one of the external oscillation signal and the internal oscillation signal and a frequency divider configured to generate the internal clock signal from the selected oscillation signal.

Furthermore, the semiconductor device according to the above-described fourth or fifth configuration may have a configuration (a sixth configuration) in which while the external oscillation signal is being used by the oscillator, the internal oscillation portion generates the internal oscillation signal when an abnormality detection function of detecting an abnormality in the external oscillation signal is enabled and stops generating the internal oscillation signal when the abnormality detection function is disabled.

Furthermore, the semiconductor device according to any of the above-described fourth to sixth configurations may have a configuration (a seventh configuration) further including a main counter configured to perform logic inversion of the first internal signal in accordance with the internal clock signal.

Furthermore, the semiconductor device according to the above-described seventh configuration may have a configuration (an eighth configuration) further including a driver configured to perform AC voltage driving of a drive control signal in accordance with a count output value of the main counter.

Furthermore, the display apparatus disclosed in the present description may have a configuration (a ninth configuration) including a host device, a display panel, and the semiconductor device according to any of the above-described first to eighth configurations, which is configured to receive display data from the host device and use the display data to drive the display panel.

Furthermore, the vehicle disclosed in the present description may have a configuration (a tenth configuration) including the display apparatus according to the above-described ninth configuration.

According to the invention disclosed in the present description, it becomes possible to provide a semiconductor device capable of detecting an abnormality in an external oscillation signal, and a display apparatus and a vehicle using the semiconductor device.

OTHER MODIFICATION EXAMPLES

Besides the foregoing embodiments, the various technical features disclosed in the present description may be variously modified without departing from the spirit of the technical ingenuity involved. For example, while the display apparatus performs the segment display in the foregoing embodiments, there may also be used a display apparatus that performs matrix display. That is, the foregoing embodiments are to be construed in all respects as illustrative and not limiting. The technical scope of the present invention is indicated by the appended claims rather than by the description of the foregoing embodiments, and it is to be understood that all changes that come within the meaning and range of equivalency of the claims are intended to be embraced therein.

The invention claimed is:

1. A semiconductor device, comprising:
    an external terminal configured to accept an external input of an external oscillation signal;
    an internal oscillation portion configured to generate an internal oscillation signal;
    a logic inversion detection portion configured to generate a reset signal upon detecting logic inversion of a first internal signal corresponding to the external oscillation signal;
    a monitor counter configured to increase or decrease a count output value in accordance with the internal oscillation signal and to reset the count output value in accordance with the reset signal; and
        an abnormality detection portion configured to detect, in accordance with the count output value, whether or not there is an abnormality in the external oscillation signal; and
    an oscillator configured to generate an internal clock signal based on one of the external oscillation signal and the internal oscillation signal,
    wherein the oscillator includes
    a selector configured to output, as a selected oscillation signal, one of the external oscillation signal and the internal oscillation signal, and
    a frequency divider configured to generate the internal clock signal from the selected oscillation signal.

2. The semiconductor device according to claim 1, further comprising:
    an error signal output circuit configured to externally output a result of detection by the abnormality detection portion as an error signal.

3. The semiconductor device according to claim 1, wherein the logic inversion detection portion includes:
    a first flip-flop configured to latch the first internal signal in synchronism with the internal oscillation signal so as to generate a second internal signal;
    a second flip-flop configured to latch the second internal signal in synchronism with the internal oscillation signal so as to generate a third internal signal; and
    a logic gate configured to determine a logic level of the reset signal in accordance with whether or not the second internal signal agrees with the third internal signal.

4. The semiconductor device according to claim 1, wherein while the external oscillation signal is being used by the oscillator, the internal oscillation portion generates the internal oscillation signal when an abnormality detection function of detecting an abnormality in the external oscillation signal is enabled and stops generating the internal oscillation signal when the abnormality detection function is disabled.

5. The semiconductor device according to claim 1, further comprising:
  a main counter configured to perform logic inversion of the first internal signal in accordance with the internal clock signal.

6. The semiconductor device according to claim 5, further comprising:
  a driver configured to perform AC voltage driving of a drive control signal in accordance with a count output value of the main counter.

7. A display apparatus, comprising:
  a host device;
  a display panel; and
  the semiconductor device according to claim 1, the semiconductor device being configured to receive display data from the host device and use the display data to drive the display panel.

8. A vehicle, comprising:
  the display apparatus according to claim 7.

* * * * *